United States Patent [19]

Zibert

[11] 4,119,870
[45] Oct. 10, 1978

[54] READ-OUT AMPLIFIER CIRCUIT FOR A DYNAMIC MOS MEMORY

[75] Inventor: Klaus Zibert, Hohenschaeftlarn, Germany

[73] Assignee: Siemens Aktiengesellschaft, Berlin & Munich, Germany

[21] Appl. No.: 798,431

[22] Filed: May 19, 1977

[30] Foreign Application Priority Data

May 24, 1976 [DE] Fed. Rep. of Germany ....... 2623219

[51] Int. Cl.$^2$ .................. H03K 5/20; G11C 7/06; H03K 3/353; H03K 3/286
[52] U.S. Cl. .................................. 307/355; 307/246; 307/279; 307/DIG. 3; 365/204; 365/205
[58] Field of Search ............... 307/238, 246, 355, 356, 307/362, 363, 279, 291, 289, DIG. 3; 365/203, 204, 205

[56] References Cited

U.S. PATENT DOCUMENTS

| | | | |
|---|---|---|---|
| 3,774,176 | 12/1973 | Stein et al. | 307/DIG. 3 X |
| 3,959,781 | 5/1976 | Mehta | 307/238 X |
| 3,978,459 | 8/1976 | Koo | 307/238 X |
| 3,993,917 | 11/1976 | Kalter | 307/DIG. 3 X |
| 4,004,284 | 1/1977 | Heeren | 340/173 CA X |
| 4,025,907 | 5/1977 | Karp et al. | 307/238 X |
| 4,028,557 | 6/1977 | Wilson | 307/DIG. 3 X |
| 4,061,999 | 12/1977 | Proebsting et al. | 307/238 X |

OTHER PUBLICATIONS

Bishop, "High-Sensitivity, High-Speed FET Sense Latch," *IBM Tech. Discl. Bull.;* vol. 18, No. 4, pp. 1021–1022; 9/1975.
Stein et al., *IEEE Journal of Solid–State Circuits;* vol. SC-7, No. 5, pp. 336–340; 10/1972.

*Primary Examiner*—Larry N. Anagnos
*Attorney, Agent, or Firm*—Hill, Gross, Simpson, Van Santen, Steadman, Chiara & Simpson

[57] ABSTRACT

A read-out amplifier circuit for a dynamic MOS memory has two arms each of which includes a switching transistor and a load transistor connected in series, the arms being connected in parallel with a feedback connection between the junction of a switching transistor and a load transistor and the control electrode of the switching transistor of the other arm. The junctions of the switching transistors and load transistors are connected to respective sub-portions of a bit line and are also connected by way of a balance transistor. The source electrodes of the switching transistors are connected to a node which is charged prior to the beginning of a reading cycle and, for evaluating a read-out signal, is discharged in a controlled manner such that the switching transistor whose drain electrode is subjected to the voltage change which gives rise to the read-out signal is rendered conductive. Following the charging of the node, the load transistors are disconnected and the balance transistor is conductive so that the voltage existing across the node influences the junction points. Then the balance transistor is disconnected and during a subsequent evaluation of a read-out signal, the controlled discharge of the node causes the other switching transistor to temporarily pass into the conductive state.

9 Claims, 7 Drawing Figures

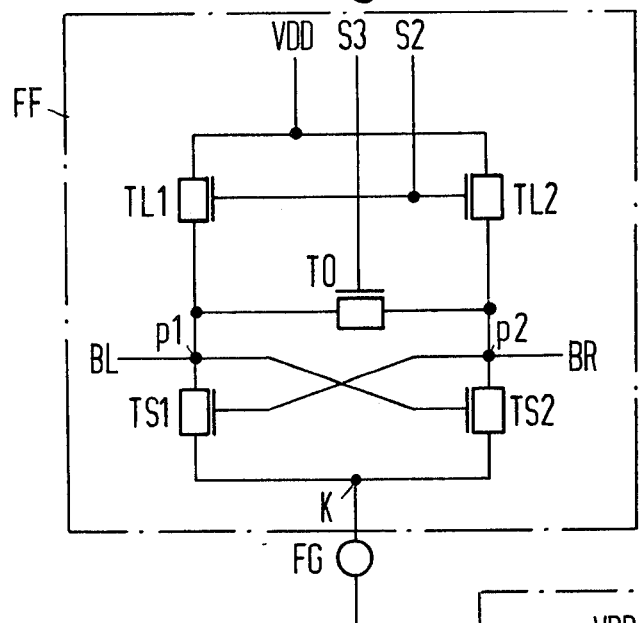
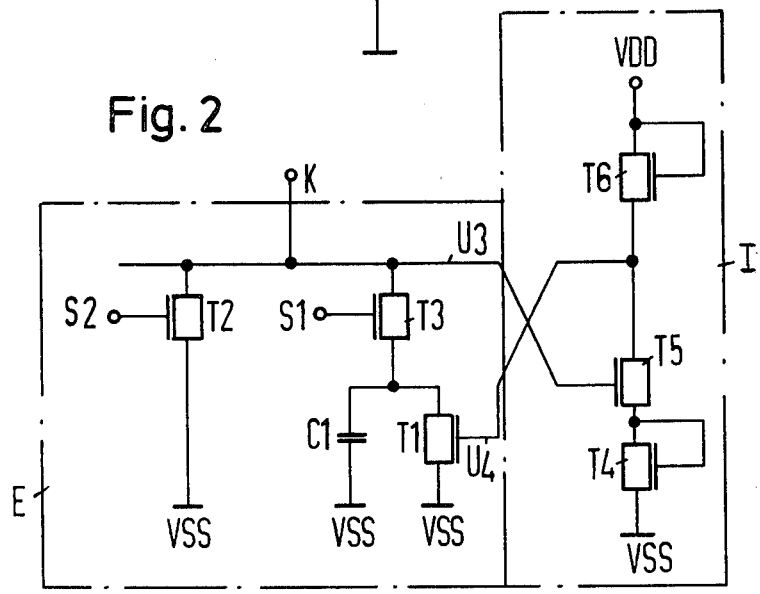

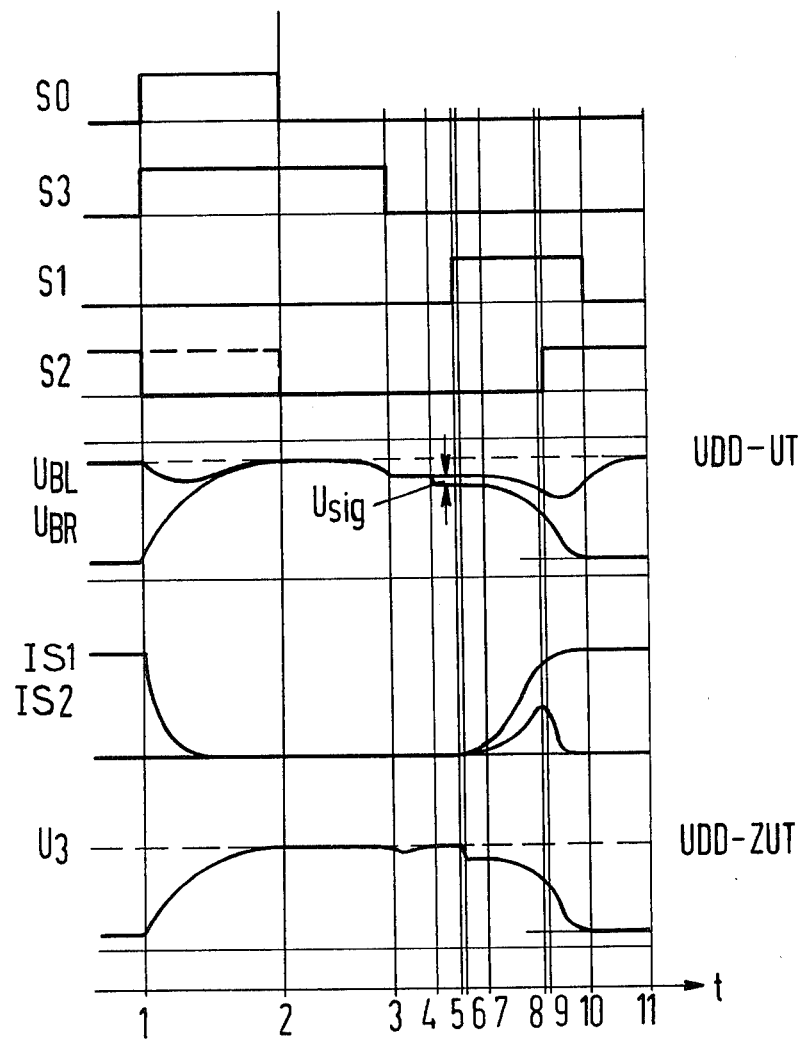

READ-OUT AMPLIFIER CIRCUIT FOR A DYNAMIC MOS MEMORY

BACKGROUND OF THE INVENTION

1. Field of the Invention

The present invention relates to a read-out amplifier circuit for a dynamic MOS memory, in which two circuit arms, each composed of a switching transistor and a load transistor, are fed back in that the connection point of the switching transistor and the load transistor in each arm is connected to the control electrode of the switching transistor in the other arm. The connection point of each arm is connected to a sub-portion of a bit line and the connection points of the two arms are connected to one another by way of a balance transistor, and wherein the source electrodes of the switching transistors are connected to a node which is discharged prior to the beginning of the reading cycle and, in order to evaluate a read-out signal, is discharged in a controlled manner such that the switching transistor across whose drain electrode occurs a change in voltage which produces the read-out signal, is rendered conductive.

2. Description of the Prior Art

In order to evaluate read-out signals of dynamic MOS memories, it is well known in the art to divide each bit line into two sub-portions, and to arrange a read-out amplifier circuit, designed as a flip-flop, between the two sub-portions. In this connection, one may refer to, for example, IEEE Journal of Solid-State Circuits, Vol. SC 7, No. 5, October 1972, Pages 336-340. A read-out amplifier circuit is constructed as a clocked flip-flop. The fundamental properties of this read-out amplifier reside in the symmetry thereof, the low dependence upon parameter fluctuations, and the automatic regeneration of the stored signals. Read-out amplifier circuits of this type are used, in particular, in MOS memories in which the individual storage cells consist of single-transistor storage cells.

A further development in MOS memory technology has resulted in an increasing rise in the storage density per storage module. This led to smaller read-out signals, and to component parameters which exhibit greater fluctuations. More suitable for evaluating read-out signals from MOS memories of this type, is an amplifier circuit, such as described, e.g. in IEEE Journal of Solid State Circuits, Vol. SC 8, No. 5, October 1973, Pages 310-318, and IEEE Journal of Solid State Circuits, Vol. 9, No. 2, April 1974, Pages 49-54. In this read-out amplifier circuit, the load transistors of the flip-flop serve only to pre-charge the sub-portions of the bit lines at the connection points between the load transistors and the switching transistors. During evaluation of a read-out signal, the load transistors remain blocked. If a signal voltage has set up on the sub-portions of a bit line, following the read-out of an item of information from a storage cell, the voltage is then slowly reduced at the connection point between the source electrodes of the switching transistors, In this manner, it is ensured that only one of the switching transistors, namely the switching transistor whose drain electrode is connected to the read-out signal, is rendered conductive. With this mode of operation, the amplification of the flip-flop is very high, and fluctuations in the geometry in the transistors and the capacitances of the bit line have virtually no significance. A disadvantage of this read-out amplifier circuit, however, resides in the relatively long evaluation time. Therefore, attempts have been made to reduce the voltage at the connection point of the source electrodes of the switching transistors in accordance with an optimum curve. Here, the curve is calculated to be such that one of the switching transistors is exactly at the blocking boundary, or alternatively operates in a weakly conductive state, in which the current is constant. This measure serves to shorten the resultant evaluation time. Nevertheless, the evaluation time is still relatively long.

SUMMARY OF THE INVENTION

The primary object of the present invention is to provide a read-out amplifier circuit which has the foregoing features, and to construct and operate the read-out amplifier circuit in such a manner that the evaluation time of a read-out signal is substantially shortened, without impairing the reliability of evaluation.

This object is realized in that following the charging of the node, the load transistors are not conductive, the transistor located between the connection points of the two arms is in the conductive state, so that the voltage occurring at the node influences the connection points of the arms in a like manner, that then the transistor located between the connection points is disconnected, and that in the subsequent evaluation of a read-out signal the discharge curve of the node is controlled such that the other switching transistor is temporarily also brought into the conductive state.

Whereas in the prior art only one of the switching transistors is brought into the conductive state during the evaluation process, in accordance with the present invention the discharge curve of the node is such that the switching transistor whose drain electrode is connected to the portion of the bit line to which no information has been read out is also temporarily brought into the conductive state during the evaluation time of the read-out signal. The discharge curve then proceeds in such a manner that the flip-flop of the read-out amplifier circuit triggers back into the state which corresponds to the information to be evaluated.

If the transistor between the connection points is disconnected, as a result of parasitic capacitances of this transistor, the voltage at the connection points of the two arms is reduced. In this manner, at the end of this process, the two switching transistors of the flip-flop are blocked, irrespectively of which threshold voltages the switching transistors possess, and irrespectively of the magnitude of the capacitances of the sub-portions of the bit line.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a schematic circuit diagram of a first exemplary embodiment of the invention in which a read-out amplifier circuit has a function generator for the production of the discharge curve at the node formed by the connection of the source electrodes of the two switching transistors;

FIG. 2 is a schematic circuit diagram illustrating an embodiment of a function generator which may be employed in practicing the present invention;

FIG. 4 is a pulse chart relating to the read-out amplifier circuit illustrated in FIG. 1;

DESCRIPTION OF THE PREFERRED EMBODIMENTS

The read-out amplifier circuit illustrated in FIG. 1 comprises a flip-flop FF and a function generator FG.

The flip-flop FF comprises two circuit arms each composed of a load transistor TL and a switching transistor TS. The one circuit arm contains the load transistor TL1 and the switching transistor TS1, whereas the second circuit arm contains the load transistor TL2 and the switching transistor TS2. The connection point between a switching transistor TS and a load transistor TL is connected to a respective sub-portion of a bit line B. Accordingly, the sub-portion BL of the bit line is connected to the connection point p1 between the load transistor TL1 and the switching transistor TS1, whereas the sub-portion BR of the bit line is connected to the connection point p2 between the load transistor TL2 and the switching transistor TS2. In addition, the connection points p1 and p2 are connected via a transistor T0, which is referred to as a balance transistor. The connection point of the source electrodes of the switching transistors TS1 and TS2 is referred to as a node K. The load transistors TL1 and TL2 are operated with the aid of a timing signal S2. A fixed voltage VDD remains connected to the load transistors TL1 and TL2.

The function generator FG can be constructed from a discharge circuit E and an inverter I, as illustrated in FIG. 2. The discharge circuit E comprises a plurality of transistors T1, T2 and T3 and a capacitor C1, and is connected to the node K. Here, the transistor T3, which is operated by a timing signal S1, is connected between the node K and a parallel connection of the transistor T1 and the capacitor C1. The transistor T1 is still connected by its control electrode to the output of the inverter I. The transistor T2, which is operated by the timing signal S2, connects the node K to another fixed voltage VSS. The capacitor C1 and the transistor T1 are likewise connected to the fixed voltage VSS.

The inverter I comprises a transistor T5 and two transistors T4 and T6 connected as diodes. The node K is connected to the control electrode of the transistor T5. A voltage U3 is formed across the node K. The output of the inverter I is connected to the transistor T1 of the discharge circuit E. The fixed voltage VDD is connected to the diode T6, and the fixed voltage VSS is connected to the diode T4.

Figure 3:
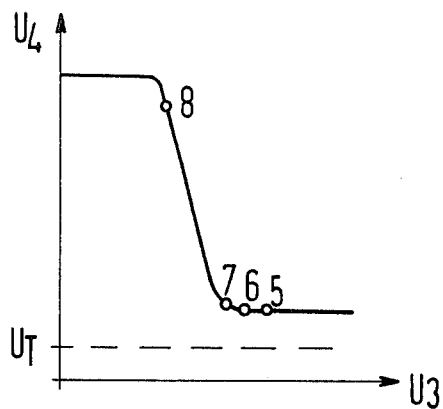
FIG. 3 is a graphic illustration of the operating curve of the inverter of the function generator illustrated in FIG. 2.

Mode of Operation (FIGS. 1, 3 and 4)

The mode of operation of the read-out amplifier circuit illustrated in FIG. 1 will be explained below in association with FIGS. 3 and 4. Here, it has been assumed that the transistors are in the form of n-channel transistors. Accordingly, the voltages illustrated in FIG. 4 are positive voltages.

Before a read-out signal connected to the bit line portions BL and BR can be evaluated, it is necessary to pre-charge the read-out amplifier circuit. For this purpose, the balance transistor T0 is rendered conductive and is fed a signal S3. In the same manner, the load transistors TL1 and TL2 can be brought into the conductive state by the connection of a timing signal S2. As illustrated in FIG. 3, in this case the node K still carries a low potential. Under these circumstances, the bit line portions BL and BR become charged to the voltage UDD-UT. Here, UT is the threshold voltage of the load transistors TL1 and TL2. Naturally, it is also possible to charge the bit line portions BL and BR via other transistors which have not been illustrated, possibly in that these transistors are connected to a signal SO (FIG. 4). In this case, it is possible to charge the bit line portions BR and BL to the voltage, for example, UDD − 2 UT. For this reason, the signal S2 which occurs during the pre-charging has only been shown in broken lines in FIG. 4. As the switching transistors TS1 and TS2 are likewise in the conductive state, the node K also becomes charged, and in fact to approximately the voltage U3 = UDD − UT − (UT + $\Delta UT_{max}$), where $\Delta UT_{max}$ is the maximum occurring rapid voltage difference between all the switching transistors TS which are connected to the node K.

At the end of the pre-charging phase which lasts from the time $t1$ to $t2$, the node K has charged and the signal SO for precharging and the signal S2 have been disconnected. This means that the load transistors TL1 and TL2 pass into the blocking state.

The pre-charging is followed by the time interval for the read-out preparation which is composed of the time zones $t2$ to $t3$, and $t3$ to $t4$.

During the time zone $t2$ to $t3$, the timing signal S3 is still connected to the balance transistor T0 so that the balance transistor is still conductive, and the bit line portions BL and BR are still connected to one another. The switching transistors TS1 and TS2 are still in the conductive state.

During the time zone from $t3$ to $t4$, the timing signal S3 is disconnected and the balance transistor T0 is blocked. In this manner the bit line portions BR and BL are cut off. The reduction in the timing signal S3 results in the voltage of the bit line portions BR and BL being reduced because of the parasitic capacitances of the balance transistor T0. Consequently, the switching transistors TS1 and TS2 are safely blocked after the time $t4$.

In the time zone $t4$ to $t5$, an item of information is read out from a storage cell, and accordingly a voltage difference, the read-out signal $U_{sig}$, is set up on the two halves of the bit line. This is indicated by the two arrows in FIG. 4 in the time zone $t4$ to $t5$ with the voltage UBL and UBR on the bit line portions BL and BR, respectively. It will be seen that a voltage difference $U_{sig}$ is set up on the bit line portions BR and BL. The switching transistors TS1 and TS2 of the flip-flop FF remain blocked.

At the time $t5$ the evaluation process begins. First of all, with the signal S1, the transistor T3 of the discharge circuit E is switched on. By way of the inverter I, with the curve corresponding to FIG. 3, the voltage U3 across the node K determines the voltage U4 across the control electrode of the transistor T1, where the transistor T1 is initially still in the conductive state. It can be seen from FIG. 3 that the voltage U4 which is emitted under these circumstances from the inverter I is approximately twice the value UT, where UT is the threshold voltage of the diode T4 and of the transistor T5. As a result of the voltage U3, the transistor T5 is in fact in its conductive state.

If the signal S1 is now connected to the transistor T3, the latter becomes conductive and a current can flow from the node K by way of the transistor T3 and the capacitor C1. This first results in the voltage across the node K dropping very rapidly (see FIG. 4, voltage U3). The rapid reduction in the voltage U3 across the node K now causes that switching transistor in the flip-flop FF whose drain electrode is subjected to the voltage change resultant from the read-out of information to be rendered conductive. If it is assumed that a storage cell which is connected to the bit line portion BL is read out, the switching transistor TS1 is rendered conductive, and therefore a current can flow through the switching transistor TS1 (currents through the switching transistors being referenced IS1 and IS2, respectively, in FIG. 4).

During the time t6 to t7, the voltage U3 across the node K is reduced very slowly, and remains virtually constant. The reason for this is that the transistor T1 in the discharge circuit remains in the same state, as can be seen by the curve in FIG. 3.

The node K now increasingly discharges, a process which is intensified by the inverter I. During the time zone t7 to t8, the voltage U4 now changes very rapidly in accordance with the steep gradient of the curve (FIG. 3), and the transistor T1 assumes its conductive state correspondingly rapidly. This results in a reduction of the voltage U3 with an increase in gradient of the curve (FIG. 3). The previously blocked switching transistor (e.g. transistor TS2) becomes conductive. Reference should be taken to the curve of the voltages UBL, UBR and of the currents IS1 and IS2 in FIG. 4. The curve of the reduction in the voltage U3 is now such that, in spite of differences in the geometry of the switching transistors TS1, TS2 and in the capacitances of the bit line portions BR and BL, thus under unfavorable conditions, the flip-flop FF again reaches its trigger point, and therefore the switching transistor TS2 becomes blocked again. This state exists at the time t8. Correspondingly, the current flowing through the switching transistor TS2 reduces again. The voltage differences on the bit line portions increase rapidly, on the other hand.

At the time t9, the timing signal S2 is connected to the load transistors TL1 and TL2 and to the transistor T2 of the discharge circuit, and these transistors are rendered conductive. The outcome is that the bit line portions BR and BL are set to the "zero" and "one" levels, respectively. The transistor T2 continues to accelerate the discharge of the node K. By the time t10, the node K is discharged, and correspondingly the transistor T5 of the inverter I is blocked. On the bit line portion, e.g. the portion BR, on which the read-out signal existed, a level has set up which is used to regenerate the storage cell which was read.

At the time t10 the timing signal S1 is disconnected and thus the discharge circuit is cut off from the flip-flop FF. At the time t11, the read-out and regenerating processes are completed.

Figure 5:
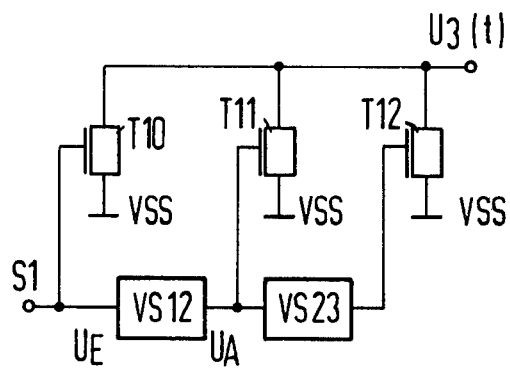
FIG. 5 is a schematic circuit diagram illustrating another exemplary embodiment of the function generator.
Figure 6:
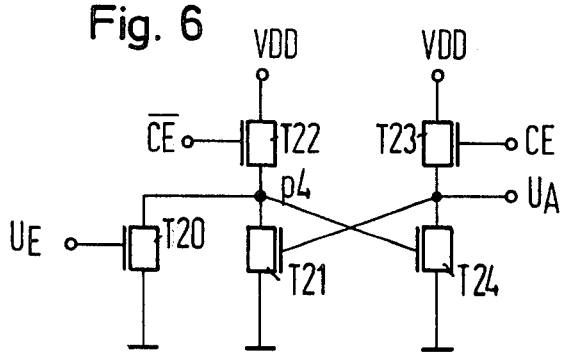
FIG. 6 is a schematic circuit diagram which illustrates a sub-circuit for the operation of the circuit arrangement illustrated in FIG. 5.
Figure 7:
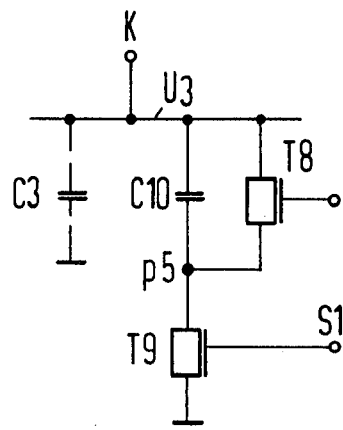
FIG. 7 is a schematic circuit diagram which illustrates another sub-circuit for the operation of the circuit arrangement illustrated in FIG. 6.

FIGS. 5, 6 and 7 illustrate another embodiment of the function generator, where the inverter I of FIG. 2 has been omitted. The circuits illustrated in FIGS. 5 and 7 are constructed in such a manner that both are connected to the node K and commonly from the function generator. The circuit arrangement illustrated in FIG. 7 is responsible for the fact that in the time zone t5 to t6 corresponding to FIG. 4, the voltage across the node K is reduced very rapidly, whereas the remainder of the discharge process of the node K is determined by the circuit arrangement in FIG. 5. The circuit arrangement corresponding to FIG. 7 is to be referred to as a jump function generator.

The jump function generator illustrated in FIG. 7 comprises a parallel arrangement of a capacitor C10 and a transistor T8. A transistor T9 is connected in series with this parallel connection and is operated by the timing signal S1. The parasitic capacitance C3 of the node K is also illustrated in FIG. 7.

During the time zone t2 to t3, the connection point p5 of the jump function generator of FIG. 7 is charged to the voltage U3 of the node K, only because the transistor T8 is conductive. At the beginning of the evaluation process, the timing signal S1 renders the transistor T9 conductive, whereas the transistor T8 is blocked. If, however, the transistor T9 is rendered conductive, this results in a charge compensation between the capacitance C3 of the node K and the capacitance C10. In this case, a jump occurs at the node K, as illustrated in FIG. 4 in the time zones t5 and t6.

The node K is still connected to the circuit corresponding to FIG. 5, which is to be referred to as a controlled voltage source. The controlled voltage source comprises a plurality of transistors T10, T11 and T12, whose controlled paths are connected in parallel. The timing signal S1 is fed directly to the first transistor T10, is fed by way of a delay circuit VS12 to the transistor T11, and by way of a further delay circuit VS23 to the transistor T12. Therefore, when a timing signal S1 is connected, first the transistor T10 is rendered conductive and the node K is initially discharged by way of the transistor T10. At the expiration of the time delay of the delay circuit VS12, the transistor T11 is additionally brought into the conductive state, as a result of which the discharge process is accelerated. On the expiration of the delay time of the delay circuit VS23, finally the transistor T12 is also rendered conductive, so that now all three transistors T10, T11 and T12 are in the conductive state. By an appropriate selection of the ratios W/L of the transistors T10, T11 and T12, it is possible to determine the shape of the discharge curve. Here, W is the width of the channel and L is the length of the channel of the transistor. It is expedient, for example, to select the ratio W/L to be 5 for the transistor T10, to be 20 for the transistor T11, and to be 200 for the transistor T12. In addition, the shape of the discharge curve is influenced by the delay times of the delay circuits VS12 and VS23.

FIG. 6 illustrates the construction of a delay circuit which may be employed in practicing the present invention. The delay circuit comprises a plurality of transistors T20, T21, T22, T23 and T24. A timing signal $\overline{CE}$ is connected to the transistor T22, and a timing signal CE is connected to the transistor T23. The transistor T20 is supplied with an input signal UE, and on the expiration on the delay time this input signal appears at the output as an output signal UA. The delay time itself is basically co-determined by the transistor T20, and in fact by the ratio W/L of this transistor. When no signal is present at the input of the delay circuit, the transistor T22 is rendered conductive and the node p4 is charged. Accordingly, the transistor T24 goes conductive, and the output voltage UA corresponds approximately to ground potential.

If a signal is connected to the input of the transistor T20, and the timing signal CE is switched over, the node p4 is discharged and after a certain length of time the transistor T24 is blocked. Then the voltage UA increases.

Thus, with the function generator illustrated in FIGS. 5–7, it is also possible to form the discharge curve corresponding to FIG. 4. The charging process of the node K during the time zone $t1$ to $t2$, and also the curve of the voltage across the node K between the charging of the node and the discharging thereof corresponds completely to the conditions described in connection with FIG. 1. If the discharge of the node K is to be initiated, again a timing signal S1 is connected to the function generator, and thus the jump function generator illustrated in FIG. 7 and the controlled voltage source illustrated in FIG. 5 are connected. With the aid of the jump function generator, during the time zone $t5$ to $t6$, the voltage across the node falls very rapidly; subsequently, by a time-staggered connection of the transistors T10, T11 and T12, the controlled voltage source ensures that the discharge curve of the node K has a form which guarantees that during the time zone $t7$ to $t9$ both switching transistors TS of the flip-flop FF are in the conductive state, whereas as the end of this time zone the flip-flop triggers into the state which is determined by the read-out signal on the bit line portions.

The above exemplary embodiment of the invention has been described on the basis of n-channel transistors. Of course, a construction with p-channel transistors is also possible.

The advantage of the read-out amplifier circuit constructed in accordance with the invention is, in particular, that the evaluation time is fundamentally shortened. This improvement is achieved in that during the evaluation of the read-out signals, both switching transistors of a flip-flop are rendered conductive in a quite specific time zone. Extremely simple circuit arrangements are produced for the realization of corresponding discharge curve across the node K.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A read-out amplifier circuit for a dynamic MOS memory, comprising:
a flip-flop including a pair of circuit arms each comprising a switching transistor and a load transistor connected together in series at a connection point, each of said transistors having a source electrode, a drain electrode and a control electrode, said source electrodes of said switching transistors connected together to form a node;
a bit line including sub-portions connected to respective connection points for receiving signals from memory cells connected to the bit line sub-portions;
the connection point of each circuit arm connected to the control electrode of the switching transistor of the other circuit arm;
charging means for charging said node to a predetermined level before read-out of a memory cell;
a balance transistor having a source electrode and a drain electrode connected to respective connection points, and a control electrode for receiving a signal to render said balance transistor conductive for a predetermined interval; and
discharging means connected to said node, whereby that one of said switching transistors which receives a voltage change on its drain electrode resulting from a read-out signal is rendered conductive and said discharging means is operable to control the discharge of said node so that the other of said switching transistors is temporarily rendered conductive.

2. The amplifier circuit of claim 1, wherein said discharge means comprises:
a function generator connected to said node and operable in response to the voltage at said node to first slowly and then rapidly discharge said node.

3. The amplifier circuit of claim 2, wherein said charging means comprises said switching transistors.

4. The amplifier circuit of claim 2, comprising:
means for rendering said load transistors conductive after evaluation of the read signal to set up signals on said bit line sub-portions for regenerating the memory cell information.

5. A read-out amplifier circuit for a dynamic metal-oxide-semiconductor memory, comprising:
a flip-flop including a pair of circuit arms each comprising a switching transistor and a load transistor connected together in series at a connection point, each of said transistors having a source electrode, a drain electrode and a control electrode, said source electrodes of said switching transistors connected together to form a node;
a bit line including sub-portions connected to respective connection points for receiving signals read from memory cells connected to the bit line sub-portions;
the connection point of each circuit arm connected to the control electrode of the switching transistor of the other circuit arm;
charging means for charging said node to a predetermined level before read-out of a memory cell;
a balance transistor having a source electrode and a drain electrode connected to respective connection points, and a control electrode for receiving a signal to render said balance transistor conductive for a predetermined interval; and
discharging means connected to said node, whereby that one of said switching transistors which receives a voltage change on its drain electrode resulting from a read-out signal is rendered conductive and said discharging means is operable to control the discharge of said node so that the other of said switching transistors is temporarily rendered conductive, said discharging means comprising a function generator connected to said node and operable in response to the voltage at said node to first slowly and then rapidly discharge said node, said function generator including
a discharge circuit connected to said node and an inverter connected to said node,
said switching transistors, said load transistors and said balance transistor constituting first, second, third, fourth and fifth transistors, said discharge circuit comprising a sixth transistor, a seventh transistor, and eighth transistor and a capacitor, said sixth, seventh and eighth transistors each including source, drain and control electrodes, said source and drain electrodes of said sixth and seventh transistors connected in series between said node and a fixed potential, said capacitor connected across said source and drain electrodes of said seventh transistor, said control electrode of said sixth transistor receiving a control signal to render said sixth transistor conductive during read signal evaluation, said control electrode of said seventh transistor connected to the output of said inverter, said source and drain electrodes of said eighth transistor connected between said node and the fixed potential, and said control electrode of said eighth transistor connected to the control electrodes of said load transistors to cause conduction of said eight transistor when said load transistors are rendered conductive.

6. The amplifier circuit of claim 5, wherein said inverter comprises:
ninth, tenth and eleventh transistors each including a source electrode, a drain electrode and a control electrode,
said source and drain electrodes of said ninth, tenth and eleventh transistors connected in series between a pair of fixed potentials with said ninth transistor between said tenth and eleventh transistors, said control electrodes of said tenth and eleventh transistors connected to the respective drain electrodes to function as diodes,
the junction of said ninth and eleventh transistors forming the output of said inverter, and
said control electrode of said ninth transistor connected to said node as the input of said inverter.

7. A read-out amplifier circuit for a dynamic metal-oxide-semiconductor memory, comprising:
a flip-flop including a pair of circuit arms each comprising a switching transistor and a load transistor connected together in series at a connection point, each of said transistors having a source electrode, a drain electrode and a control electrode, said source electrodes of said switching transistors connected together to form a node;
a bit lin including sub-portions connected to respective connection points for receiving signals read from memory cells connected to the bit line sub-portions;
the connection point of each circuit arm connected to the control electrode of the switching transistor of the other circuit arm;
charging means for charging said node to a predetermined level before read-out of a memory cell;
a balance transistor having a source electrode and a drain electrode connected to respective connection points, and a control electrode for receiving a signal to render said balance transistor conductive for a predetermined interval; and
discharging means connected to said node, whereby that one of said switching transistors which receives a voltage change on its drain electrode resulting from a read-out signal is rendered conductive and said discharging means is operable to control the discharge of said node so that the other of said switching transistors is temporarily rendered conductive, said discharge means comprising
a jump-function generator operable to rapidly discharge said node at the initiation of discharging, and
a controlled voltage source for a slower discharging during the remainder of the discharge process.

8. The amplifier circuit of claim 7, wherein said switching transistors, said load transistors and said balance transistor constitute first, second, third, fourth and fifth transistors, and said jump-function generator comprises:
sixth and seventh transistors each including control, source and drain electrodes, said source and drain electrodes connected in series between said node and a fixed potential; and
a capacitor connected across said source and drain electrodes of said sixth transistor,
said control electrode of said sixth transistor receiving a control signal to render the transistor conductive between charging and discharging of the node, and
said control electrode of said seventh transistor receiving a control signal to render that transistor conductive during read signal evaluation.

9. The amplifier circuit of claim 7, wherein said switching transistors, said load transistors and said balance transistor constitute first, second, third, fourth and fifth transistors, and said controlled voltage source comprises:
sixth, seventh and eighth transistors each including a control electrode, a source electrode and a drain electrode; and
first and second delay circuits, each having an input and an output;
said source and drain electrodes of said sixth, seventh and eighth transistors connected between said node and a fixed potential,
said control electrode of said sixth transistor and said input of said first delay circuit connected together and adapted to receive a timing signal,
said control electrode of said seventh transistor, said output of said first delay circuit and said input of said second delay circuit connected together, and
said control electrode of said eighth transistor and the output of said second delay circuit connected together,
the width to length ratio of the channel of said sixth transistor being less than that of said seventh transistor and that of said seventh transistor being smaller than that of said eighth transistor.

* * * * *